United States Patent
Li et al.

(10) Patent No.: US 8,575,024 B2
(45) Date of Patent: Nov. 5, 2013

(54) SEMICONDUCTOR DEVICE HAVING AIR GAP AND METHOD FOR MANUFACTURING THE SAME

(75) Inventors: Fan Li, Shanghai (CN); Zhongshan Hong, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 129 days.

(21) Appl. No.: 13/226,374

(22) Filed: Sep. 6, 2011

(65) Prior Publication Data
US 2012/0273962 A1   Nov. 1, 2012

(30) Foreign Application Priority Data
Apr. 28, 2011  (CN) .......................... 2011 1 0109621

(51) Int. Cl.
*H01L 21/44* (2006.01)
(52) U.S. Cl.
USPC .......................................... 438/672; 257/774
(58) Field of Classification Search
USPC .................................................. 257/522, 774
See application file for complete search history.

(56) References Cited

U.S. PATENT DOCUMENTS

| 5,461,003 | A | * | 10/1995 | Havemann et al. | ............ 438/666 |
| 5,627,082 | A | * | 5/1997 | Beratan et al. | .................. 438/55 |
| 2006/0099785 | A1 | * | 5/2006 | Fuller et al. | .................... 438/597 |
| 2007/0076339 | A1 | * | 4/2007 | Lur et al. | ......................... 361/56 |

FOREIGN PATENT DOCUMENTS

CN    1967799    5/2007

OTHER PUBLICATIONS

Santi Kulprathipanja, "Zeolites in Industrial Separation and Catalysis", 2010, WILEY-VCH Verlag GmbH & Co. KGaA, Weinheim, Germany, pp. 1 and 16.*

* cited by examiner

*Primary Examiner* — Kimberly Rizkallah
*Assistant Examiner* — Caleb Henry
(74) *Attorney, Agent, or Firm* — Anova Law Group, PLLC

(57) ABSTRACT

A method for manufacturing a semiconductor device having an air gap, includes: providing a substrate having a first dielectric layer and a second dielectric layer formed thereon successively; forming a mask layer on the second dielectric layer; patterning the first and the second dielectric layer by using the mask layer as a mask so as to form a plurality of grooves; filling a conducting material into the grooves; removing redundant conducting material on the second dielectric layer utill the second dielectric layer is exposed so as to form a plurality of conductive trenches; forming a molecular sieve on the second dielectric layer and the conductive trenches; and removing the second dielectric layer partly or completely by flowing a reactant gas towards the second dielectric layer through the molecular sieve, so as to form an air gap. It is novel and simple to form an air gap through molecular sieve.

13 Claims, 6 Drawing Sheets

SEMICONDUCTOR DEVICE HAVING AIR GAP AND METHOD FOR MANUFACTURING THE SAME

CROSS REFERENCE TO RELATED APPLICATIONS

The present application claims the priority of Chinese Patent Application No. 201110109621.X, entitled "Semiconductor Device Having Air Gap and Method for Manufacturing the same", and filed on Apr. 28, 2011, the entire disclosure of which is incorporated herein by reference.

FIELD OF THE INVENTION

The present invention relates generally to semiconductor manufacturing field, and more particularly relates to semiconductor device having an air gap and method for manufacturing the same.

BACKGROUND OF THE INVENTION

With the rapid development of semiconductor manufacturing technology, semiconductor chip is making progress in the direction of highly integration, in order to achieve much faster operating speed and more data storage content and more performance. The higher the integration level of semiconductor chip is, the smaller the critical dimension (CD) of semiconductor chip is.

Along with the critical dimension of semiconductor chip gradually becomes small, the influence on the operating speed which RC delay makes is becoming more and more obvious. How to reduce RC delay is one of the hot issues being studied by the technical personnel in the field. One of the methods to solve RC delay is to decrease parasitic capacitance between metal lines.

A plurality of methods to decrease parasitic capacitance have been developed in prior art, for example, to fill multiaperture low-K dielectric material between metal lines. However, multiaperture material is fragile which cause the worse reliability for the semiconductor device using multiaperture low-K dielectric material.

Another method has been developed to form air gap between metal lines so as to decrease dielectric constant and then decrease parasitic capacitance, for example, employing self-organizing organic polymer to form air gap. But aforesaid method is harder to compatible with the existing processing method of semiconductor, and the manufacturing process is more complex.

SUMMARY OF THE INVENTION

Embodiments of the present invention provide a semiconductor device having an air gap and a method for manufacturing the same.

In one embodiment, a method for manufacturing a semiconductor device having an air gap includes:
providing a substrate having a first dielectric layer and a second dielectric layer formed thereon successively;
forming a mask layer on the second dielectric layer;
patterning the first dielectric layer and the second dielectric layer by using the mask layer as a mask so as to form a plurality of grooves;
filling a conducting material into the grooves;
removing redundant conducting material on the second dielectric layer until the second dielectric layer is exposed so as to form a plurality of conductive trenches;
forming a molecular sieve on the second dielectric layer and the conductive trenches; and
removing the second dielectric layer partly or completely by flowing a reactant gas towards the second dielectric layer through the molecular sieve, so as to form an air gap.

In another embodiment, a semiconductor device having an air gap includes: a substrate; a first dielectric layer formed on the substrate; a plurality of conductive trenches formed in the first dielectric layer, wherein a surface of the conductive trenches is higher than a surface of the first dielectric layer; an air gap formed between at least a pair of conductive trenches adjacent; a molecular sieve located on the conductive trenches.

Compared with the prior art, this invention has the following advantages:
It is novel and simple to form an air gap by use of a molecular sieve.
It is convenient to design and implement the configuring position and number of the air gap through a hard mask layer.

DETAILED DESCRIPTION OF THE EMBODIMENTS

Although the present invention has been disclosed hereinafter as above with reference to preferred embodiments in details, the present invention can be implemented in other embodiments which are different. Therefore, the present invention should not be limited to the embodiments disclosed here.

The invention is detailed described combined with schematic diagrams. When describing the embodiments of this invention, the schematic diagrams are just exemplary to be convenient for description, which should not be considered to restrict the protection scope of the present invention.

Figure 1:
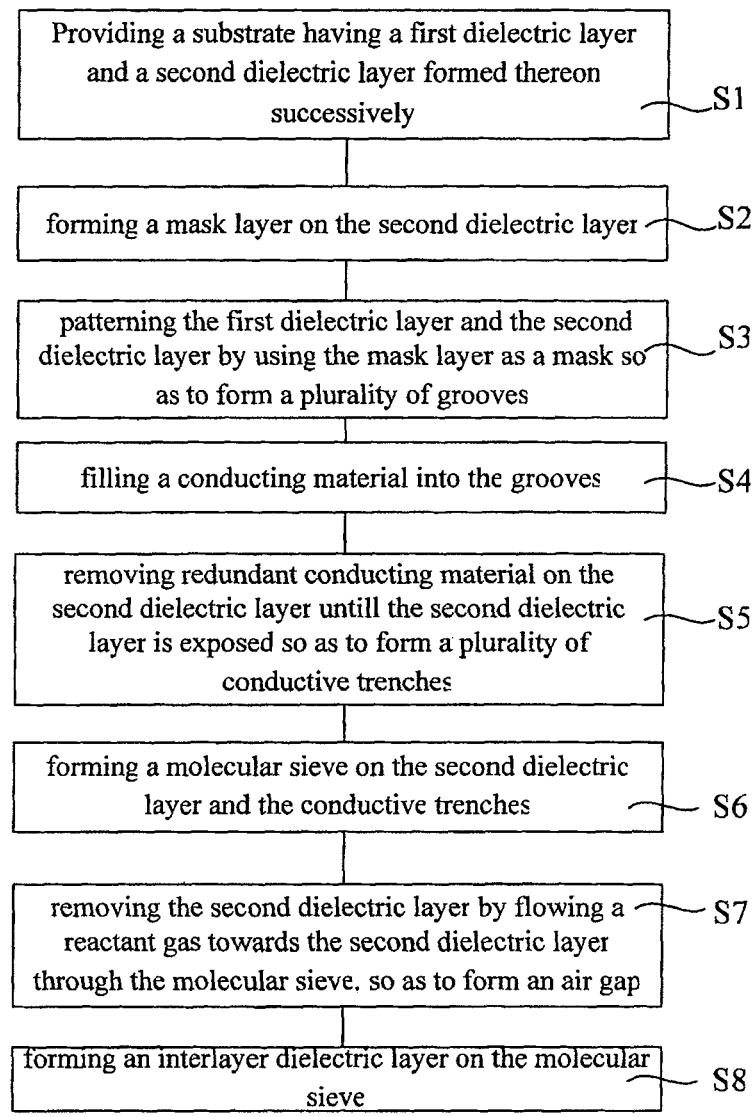
FIG. 1 shows a flow chart of a method for manufacturing a semiconductor device having an air gap, in accordance with one embodiment of the present invention.

Referring to FIG. 1, which shows a flow chart of a method for manufacturing a semiconductor device having an air gap in accordance with one embodiment of the present invention, the method generally includes the following steps:

Step S1, providing a substrate having a first dielectric layer and a second dielectric layer formed thereon successively;

Step S2, forming a mask layer on the second dielectric layer;

Step S3, patterning the first dielectric layer and the second dielectric layer by using the mask layer as a mask so as to form a plurality of grooves;

Step S4, filling a conducting material into the grooves;

Step S5, removing redundant conducting material on the second dielectric layer until the second dielectric layer is exposed so as to form a plurality of conductive trenches;

Step S6, forming a molecular sieve on the second dielectric layer and the conductive trenches;

Step S7, removing the second dielectric layer by flowing reactant gas towards the second dielectric layer through the molecular sieve, so as to form an air gap;

Step S8, forming an interlayer dielectric layer on the molecular sieve.

Hereunder, the present invention will be described in detail with reference to embodiments, in conjunction with the accompanying drawings.

FIG. 2 to FIG. 9 are schematic cross-sectional views illustrating a method for manufacturing a semiconductor device having an air gap according to a first embodiment of the present invention.

Figure 2:
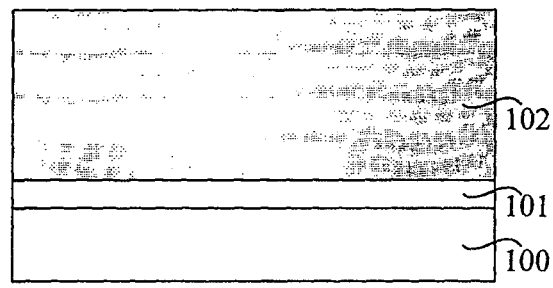
FIG. 2 to FIG. 9 are schematic cross-sectional views illustrating a method for manufacturing a semiconductor device having an air gap according to a first embodiment of the present invention.

Referring to FIG. 2, a substrate 100 is provided. The substrate 100 may comprise monocrystalline silicon, silicon germanium, or silicon on insulator (SOD.

A first dielectric layer 101 is formed on the substrate 100. The first dielectric layer 101 acts as a stop layer during the subsequent step of removing the second dielectric layer. In this embodiment, the first dielectric layer 101 may comprise silicon nitride ($Si_3N_4$), NBLoK (compounds includes Si, C, H, and N), Nitrogen Doped Silicon Carbon (NDC), and the like. In this embodiment, a thickness of the first dielectric layer 101 ranges from about 200 Å to about 800 Å.

A second dielectric layer 102 is formed on the first dielectric layer 101. The second dielectric layer 102 generally uses easily removable material so as to be removed in the subsequent step. In this embodiment, an ashing process is used during the subsequent step of removing the second dielectric layer 102. The second dielectric layer 102 may comprise ashable materials. For example, oxygen is used during the ashing process. Accordingly, the second dielectric layer 102 may comprise one or more of carbon (C) dielectric layer, nitrogen (N) dielectric layer, and hydrogen (H) dielectric layer. More specifically, the second dielectric layer 102 may comprise amorphous carbon, Diamond-like carbon (DLC), and the like.

After the second dielectric layer 102 is removed, the space occupied by the second dielectric layer 102 forms an air gap. Therefore, it is convenient to arrange the thickness of the second dielectric layer 102 according to the design requirement of the air gap.

Figure 3:
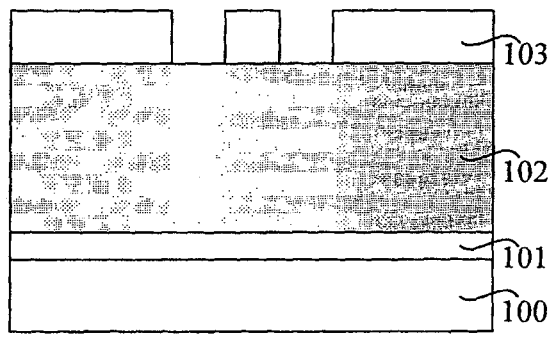

Please refer to FIG. 3 which shows the step S2. A Mask layer 103 is formed on the second dielectric layer 102. In this embodiment, the mask layer 103 may be a patterned photoresist layer, or a patterned tri-layer hard mask (Tri-layer HM). The pattern of the mask layer 103 matches with the conductive trenches formed subsequently. In practical application, the pattern of the mask layer 103 is configured according to the design requirement of the conductive trenches.

Figure 4:
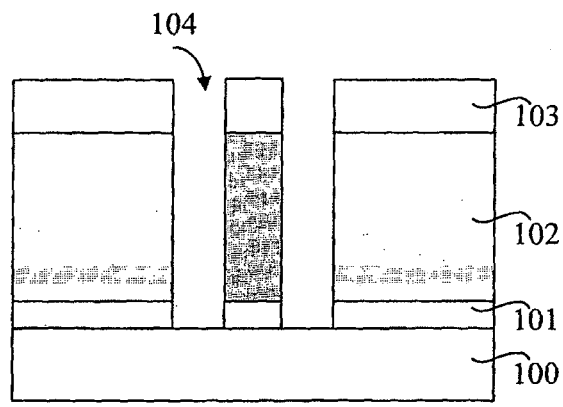

Please refer to FIG. 4 which shows the step 3. The first dielectric layer 101 and the second dielectric layer 102 are patterned by use of the mask layer 103 as a mask so as to form a plurality of grooves 104. In this embodiment, a dry etching process is used to transfer the pattern of the mask layer 103 to the first dielectric layer 101 and the second dielectric layer 102. The substrate 100 acts as a stop layer in the dry etching process.

Figure 5:
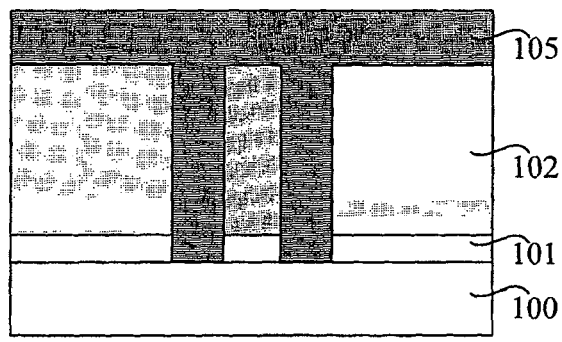

Please refer to FIG. 5 which shows the step 4. The grooves 104 are filled with conducting materials so as to form a conductive layer 105. In this embodiment, the conducting material may comprise metal materials, such as copper, and the like, but not limited thereto.

Figure 6:
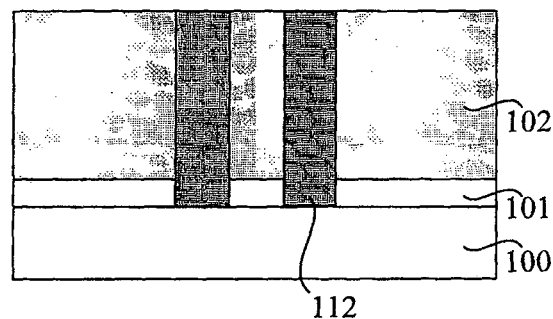

Please refer to FIG. 6 which shows the step 5. The redundant conducting material on the second dielectric layer 102 is removed until the second dielectric layer 102 is exposed so as to form a plurality of conductive trenches 112. More specifically, the redundant conducting material is removed by a chemical mechanical polishing (CMP) process. In this embodiment, the conductive trenches 112 may comprise copper, but not limited thereto.

Figure 7:
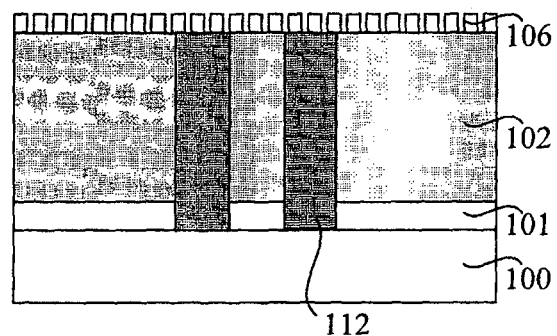

Please refer to FIG. 7 which shows the step 6. After the CMP process, the surface of the second dielectric layer 102 is substantially flush with the surface of the conductive trenches 112. A molecular sieve 106 is formed on the second dielectric layer 102 and the conductive trenches 112.

The molecular sieve 106 comprises a chemical material having a net structure. The molecular sieve 106 has micropores arranged regularly therein, as shown in FIG. 7. In general, the size of the micropores ranges from about 3 Å to about 20 Å.

More specifically, the molecular sieve 106 may comprise crystalline silicate or aluminosilicate.

In this embodiment, the method for forming the molecular sieve 106 includes: firstly, spining a reactant material covering on the surface of the second dielectric layer 102 and the conductive trenches 112, wherein the reactant material includes: silicon compound (such as sodium silicate, ludox, and the like), aluminium compound (such as hydrated alumina, aluminum salt, and the like), alkali (such as sodium hydroxide, potassium hydroxide, and the like) and water; heating the reactant material which is spined covering on the surface of the second dielectric layer 102 and the conductive trenches 112 so as to dissolve out molecular sieve crystal; lastly, scouring off the rest of reactant material. The process for forming the molecular sieve 106 in the present invention is not limited to the above.

In this embodiment, a thickness of molecular sieve 106 ranges from about 100 Å to about 400 Å.

Figure 8:
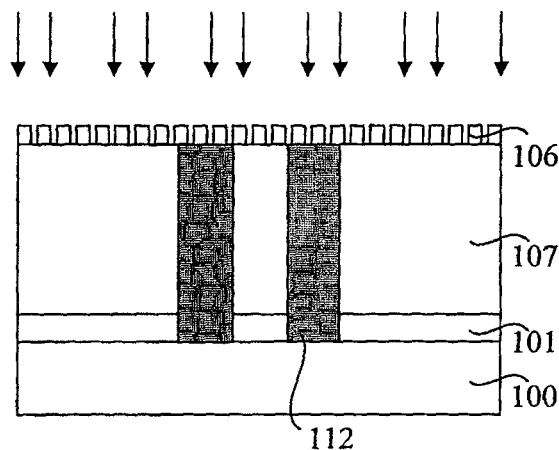

Please refer to FIG. 8 which shows the step 7. A reactant gas is flowed towards the second dielectric layer 102 through the molecular sieve 106 so as to remove the second dielectric layer 102.

In this embodiment, the second dielectric layer 102 may include carbon. Therefore, the second dielectric layer 102 containing carbon reacts with oxygen to form carbon dioxide which tends to be removed as carbon dioxide is in a gas state. As a result, the space occupied originally by the second dielectric layer 102 forms an air gap 107.

More specifically, oxygen plasma with high energy is flowed towards the second dielectric layer 102 through the molecular sieve 106. The oxygen plasma with high energy reaches the surface of the second dielectric layer 102 passing through the micropores within the molecular sieve 106, and then reacts with the second dielectric layer 102 so as to remove the second dielectric layer 102 completely until the first dielectric layer 101 is exposed.

Besides, oxygen plasma does not react with the conductive trenches 112. Therefore, the space occupied by the second dielectric layer 102 between a pair of the conductive trenches 112 adjacent forms the air gap 107.

The air gap 107 is able to decrease parasitic capacitance between the conductive trenches 112, thereby decreasing RC delay.

Figure 9:
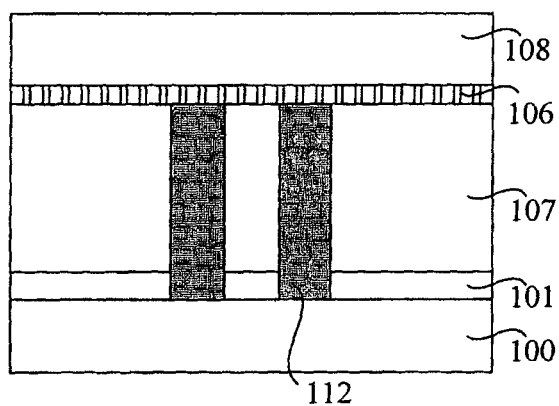

Please refer to FIG. 9 which shows the step 8. An interlayer dielectric layer 108 is formed on the molecular sieve 106. Afterwards, other semiconductor devices may be formed on interlayer dielectric layer 108.

It is to be noted that the second dielectric layer 102 is removed completely in the above embodiment, but not limited thereto in the invention. When the reactant gas is flowed towards the second dielectric layer through the molecular sieve, the second dielectric layer 102 may be removed partly, resulting in forming an air gap on the rest of second dielectric layer 102. Although the height of the air gap formed in such a way is lower, the air gap still can decrease parasitic capacitance, thereby decreasing RC delay.

Figure 10:
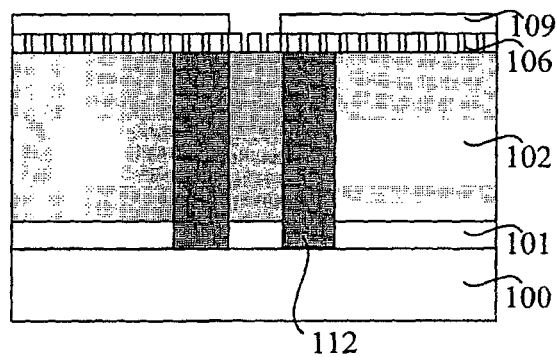
FIG. 10 to FIG. 12 are schematic cross-sectional views illustrating a method for manufacturing a semiconductor device having an air gap according to a second embodiment of the present invention.
Figure 11:
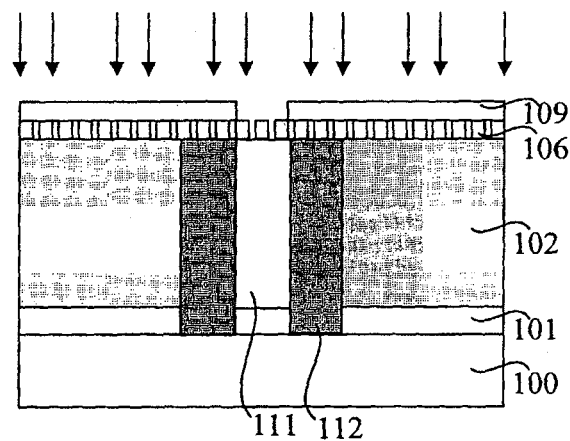
Figure 12:
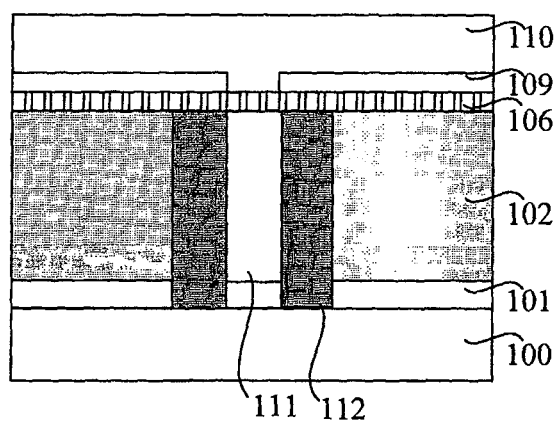

The present invention further provides another embodiment of semiconductor device having an air gap, which is the same as the foregoing embodiment from step 1 to step 6 and not described herein. The step 7 and step 8 accompanying with Figures will be described in detail hereafter. FIG. 10 to FIG. 12 are schematic cross-sectional views illustrating a method for manufacturing a semiconductor device having an air gap according to a second embodiment of the present invention.

Referring to FIG. 10, a hard mask layer 109 is formed on the molecular sieve 106 after the step of forming the molecular sieve 106 on the second dielectric layer 102, and before the step of flowing reactant gas towards the second dielectric layer 102 through the molecular sieve 106. The subsequent step of removing the second dielectric layer 102 is performed by using the hard mask layer 109 as a mask. Those skilled in the art may configure position and number of the air gap through the pattern of hard mask layer 109.

In this embodiment, the central position of the hard mask layer 109 is configured with a groove, which makes the central position of the molecular sieve 106 exposed, whereas the other portion of the molecular sieve 106 is covered by the hard mask layer 109.

More specifically, the hard mask layer 109 may comprise silicon nitride ($Si_3N_4$).

Please refer to FIG. 11, which shows the step 7. A reactant gas is flowed towards the second dielectric layer 102 by using the hard mask layer 109 as a mask. The reactant gas reaches the second dielectric layer 102 through the molecular sieve 106 exposed by the hard mask layer 109, and reacts with the second dielectric layer 102, until the second dielectric layer 102 is removed.

Because the reactant gas does not react with the conductive trenches 112, the second dielectric layer 102 which is between a pair of adjacent conductive trenches 112 and has a corresponding position to the groove in the hard mask layer 109 is able to be removed. Thereby, an air gap is formed between a pair of adjacent conductive trenches 112 corresponding to where the groove is positioned in the hard mask layer 109. However, the reactant gas can not pass through the molecular sieve 106 as a result of being covered by the hard mask layer 109. Therefore, the second dielectric layer 102 at the position covered by the hard mask layer 109 does not contact with the reactant gas and is not removed.

Please refer to FIG. 12, which shows the step 8, an interlayer dielectric layer 110 is formed on the hard mask layer 109.

Compared with the first embodiment, it is more convenient to configure position and number of the air gap according to the hard mask layer 109 in this embodiment.

It should be noted that the embodiments of the present invention may be applied in the processes for forming connective trenches or connective structures of the kind during the subsequent steps, so as to form semiconductor devices having an air gap, which decreases RC delay and improves the operating speed of the semiconductor devices.

Correspondingly, a semiconductor device having an air gap is provided according to another embodiment in the invention. Referring to FIG. 12, the semiconductor device having an air gap provided in the embodiment, includes: a substrate 100; a first dielectric layer 101 formed on the substrate 100; a plurality of conductive trenches 112 formed in the first dielectric layer, wherein a surface of the conductive trenches is higher than a surface of the first dielectric layer 101; an air gap 107 formed between at least a pair of conductive trenches 112 adjacent, and a second dielectric layer 102 filled between the other adjacent conductive trenches; a molecular sieve 106 located on the conductive trenches 112; an interlayer dielectric layer located on the molecular sieve 106.

In one embodiment, the semiconductor device having an air gap further includes a hard mask layer 109 formed between the molecular sieve 106 and the interlayer dielectric layer 110.

The second dielectric layer 102 covered by the hard mask layer 109 is not removed. Therefore, the molecular sieve 106 is still located on the second dielectric layer 102.

Because the reactant gas does not react with the conductive trenches 112, the second dielectric layer 102 which is between a pair of adjacent conductive trenches 112 and has a corresponding position to the groove in the hard mask layer 109 is able to be removed. Thereby, an air gap 111 is formed between a pair of adjacent conductive trenches 112 corresponding to where the groove is positioned in the hard mask layer 109. However, the reactant gas cannot pass through the molecular sieve 106 as a result of being covered by the hard mask layer 109. Therefore, the second dielectric layer 102 at the position covered by the hard mask layer 109 does not contact with the reactant gas and is not removed.

Although the present invention has been disclosed above with reference to preferred embodiments thereof, it should be understood that the invention is presented by way of example only, and not limitation. Those skilled in the art can modify and vary the embodiments without departing from the spirit and scope of the present invention.

What is claimed is:

1. A method for manufacturing a semiconductor device having an air gap, comprising:
providing a substrate having a first dielectric layer and a second dielectric layer formed thereon successively;
forming a mask layer on the second dielectric layer;
patterning the first dielectric layer and the second dielectric layer by using the mask layer as a mask so as to form a plurality of grooves;
filling a conducting material into the grooves;
removing redundant conducting material on the second dielectric layer until the second dielectric layer is exposed so as to form a plurality of conductive trenches;
forming a molecular sieve on the second dielectric layer and the conductive trenches;
forming a hard mask layer on the molecular sieve, wherein the hard mask layer comprises a groove through the hard mask layer and positioned between at least one pair of adjacent conductive trenches; and
removing a portion of the second dielectric layer by flowing a reactant gas towards the second dielectric layer through a portion of the molecular sieve corresponding to the groove of the hard mask layer, to form an air gap between the at least one pair of adjacent conductive trenches.

2. The method according to claim 1, wherein the molecular sieve has micropores arranged regularly which has a size ranged from about 3 Å to about 20 Å.

3. The method according to claim 1, wherein the molecular sieve comprises crystalline silicate or aluminosilicate.

4. The method according to claim 1, wherein the second dielectric layer comprises ashable materials, and the step of removing the portion of the second dielectric layer by flowing the reactant gas towards the second dielectric layer through the molecular sieve, to form an air gap comprises an ashing process.

5. The method according to claim 4, wherein the second dielectric layer comprises one or more of C, N, or H; and the ashing process comprises flowing oxygen plasma towards the second dielectric layer through the molecular sieve.

6. The method according to claim 5, wherein the second dielectric layer comprises amorphous carbon, or Diamond-like carbon.

7. The method according to claim 1, wherein the first dielectric layer comprises silicon nitride, Nitrogen Doped Silicon Carbon, or compounds comprised of Si, C, H, or N.

8. The method according to claim 1, wherein the hard mask layer comprises silicon nitride.

9. The method according to claim 1, further comprising forming an interlayer dielectric layer on the hard mask layer, wherein the interlayer dielectric layer is also formed on the molecular sieve to fill the groove through the hard mask layer.

10. The method according to claim 9, wherein the interlayer dielectric layer is used to form one or more other semiconductor devices thereon.

11. A semiconductor device having an air gap, comprising:
a substrate;
a first dielectric layer formed on the substrate;
a second dielectric layer formed on the first dielectric layer;
a plurality of conductive trenches formed in the first dielectric layer and through the second dielectric layer, wherein an air gap is formed through the second dielectric layer and between at least a pair of adjacent conductive trenches;
a molecular sieve located on the conductive trenches, the air gap, and the second dielectric layer; and
a hard mask layer disposed on the molecular sieve, wherein the hard mask layer comprises a groove through the hard mask layer and positioned corresponding to the air gap between the at least one pair of adjacent conductive trenches.

12. The device according to claim 11, further comprising an interlayer dielectric layer disposed on the hard mask layer, wherein the interlayer dielectric layer is also formed on the molecular sieve to fill the groove through the hard mask layer.

13. The device according to claim 12, wherein the interlayer dielectric layer is used to form one or more other semiconductor devices thereon.

* * * * *